United States Patent [19]
Taylor et al.

[11] Patent Number: 5,684,506
[45] Date of Patent: Nov. 4, 1997

[54] DIGITAL RECORDER APPARATUS WITH GRAPHICAL DISPLAY REPRESENTATION AND METHOD

[75] Inventors: Charles E. Taylor, San Rafael, Calif.; Edwin McAuley, Hong Kong, Hong Kong; Edward C. McKinney, San Rafael, Calif.

[73] Assignee: Sharper Image Corporation, San Francisco, Calif.

[21] Appl. No.: 531,459

[22] Filed: Sep. 20, 1995

[51] Int. Cl.⁶ .................................................. G06F 17/30
[52] U.S. Cl. .............. 345/133; 369/27; 369/30; 395/348
[58] Field of Search ............... 345/133; 360/40, 360/48, 39, 55, 62, 5; 364/920, 952; 369/30, 32, 27, 28

[56] References Cited

U.S. PATENT DOCUMENTS

| | | | |
|---|---|---|---|
| 3,470,777 | 10/1969 | Flubarker . | |
| 3,882,538 | 5/1975 | Lowe | 360/9 |
| 4,638,389 | 1/1987 | Barth | 360/72.1 |
| 4,812,940 | 3/1989 | Takenaga | 360/137 |
| 4,841,387 | 6/1989 | Rindfuss | 360/72.1 |
| 4,868,806 | 9/1989 | Sakagami | 369/58 |
| 5,191,645 | 3/1993 | Carlucci et al. | 395/159 |
| 5,204,706 | 4/1993 | Saito | 352/129 |
| 5,339,203 | 8/1994 | Henits et al. | 360/39 |
| 5,459,830 | 10/1995 | Ohba et al. | 395/152 |
| 5,504,917 | 4/1996 | Austin | 395/800 |
| 5,544,352 | 8/1996 | Egger | 395/600 |
| 5,592,608 | 1/1997 | Weber et al. | 395/350 |

*Primary Examiner*—Mark R. Powell
*Assistant Examiner*—Vincent E. Kovalick
*Attorney, Agent, or Firm*—Flehr Hohbach Test Albritton & Herbert LLP

[57] ABSTRACT

A hand-held digital recorder apparatus (10) including a digital memory unit (11) formed to store independent data records, and retrieve selected ones of the data records. An electronic unit (12), coupled to the digital memory unit (11), is included which determines the storage location and data length of a respective data record in the digital memory (11). A graphical display device (13), coupled to the electronic unit (12), graphically represents the length and location of the data records in the digital memory unit (11) by corresponding record icons (14) to visually facilitate retrieval of the selected ones of the data records. A method for accessing stored data records from a digital memory unit (11) of a hand-held digital recorder apparatus (10) is also included.

36 Claims, 7 Drawing Sheets

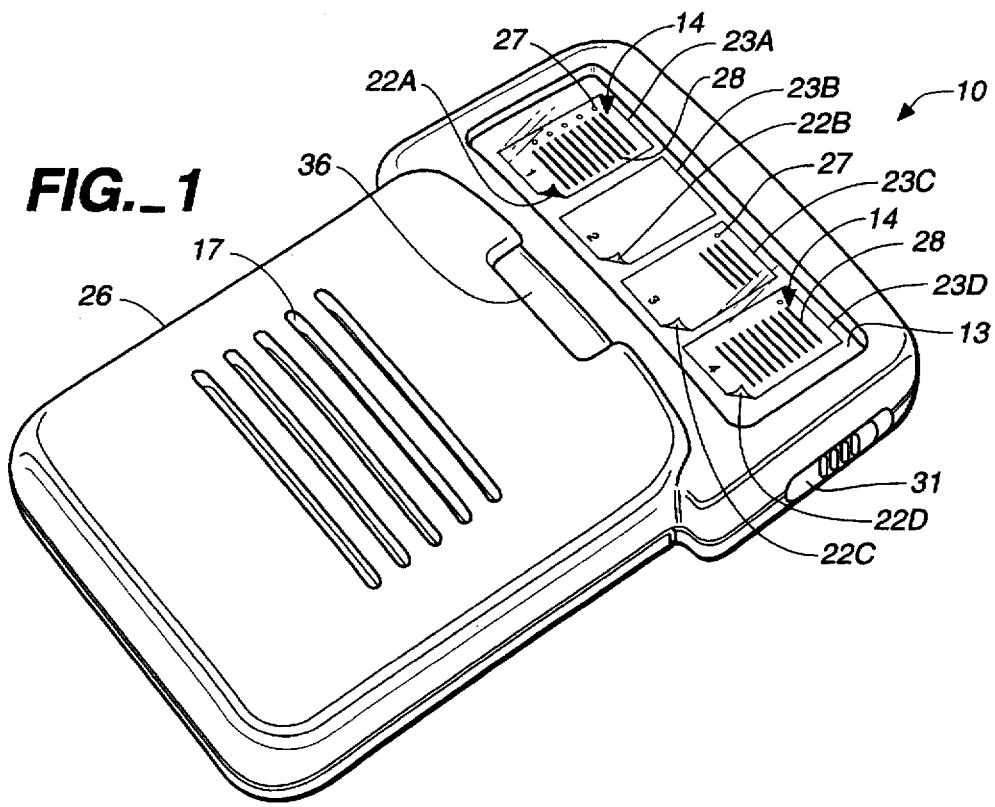
FIG._1
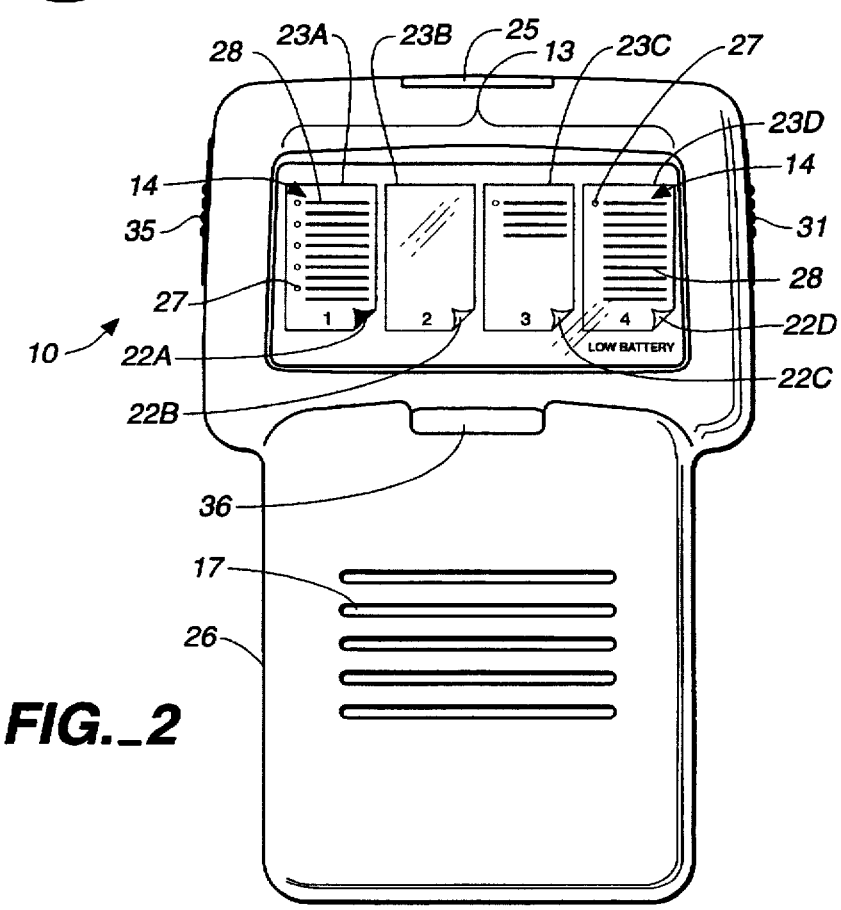
FIG._2

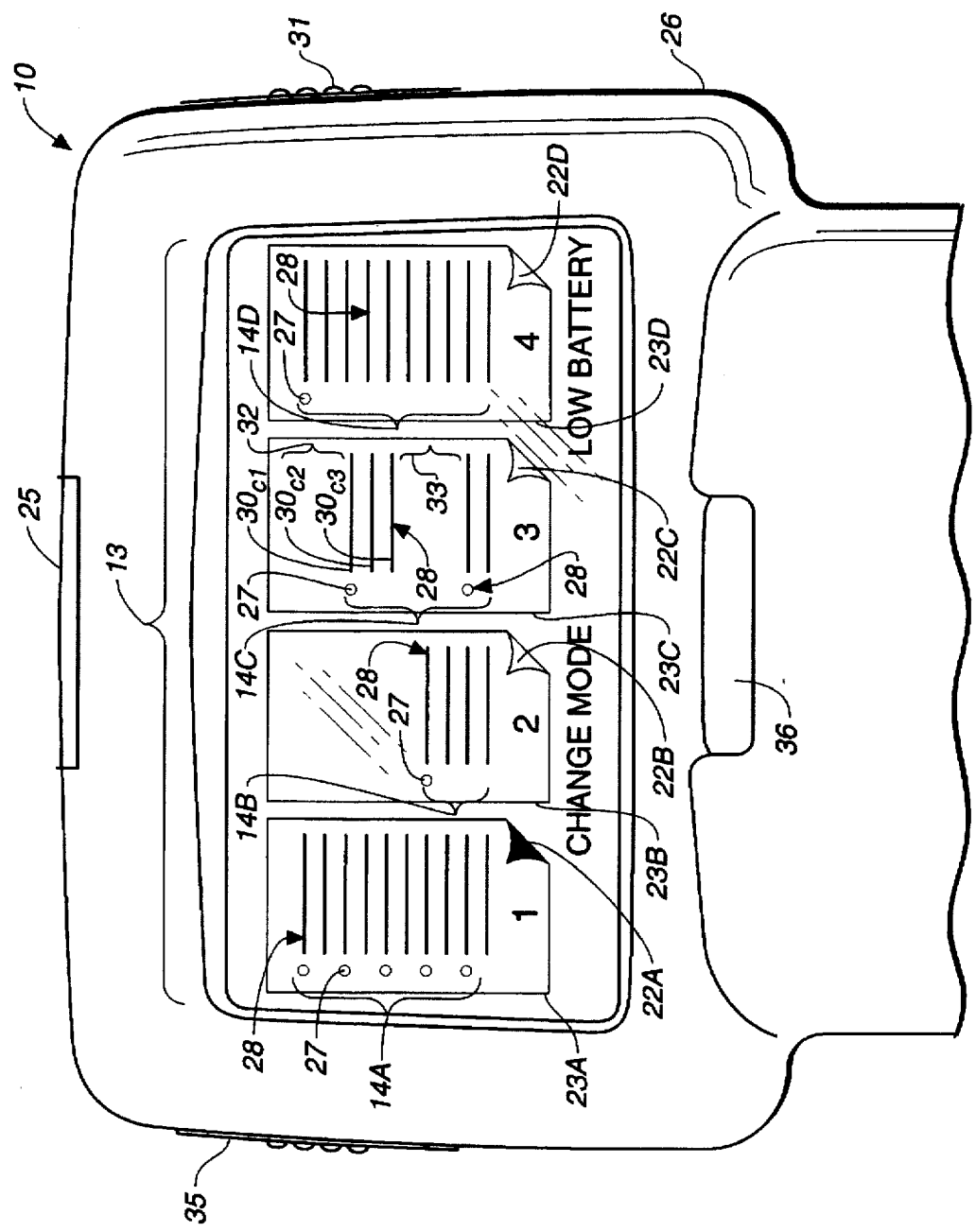
FIG._3

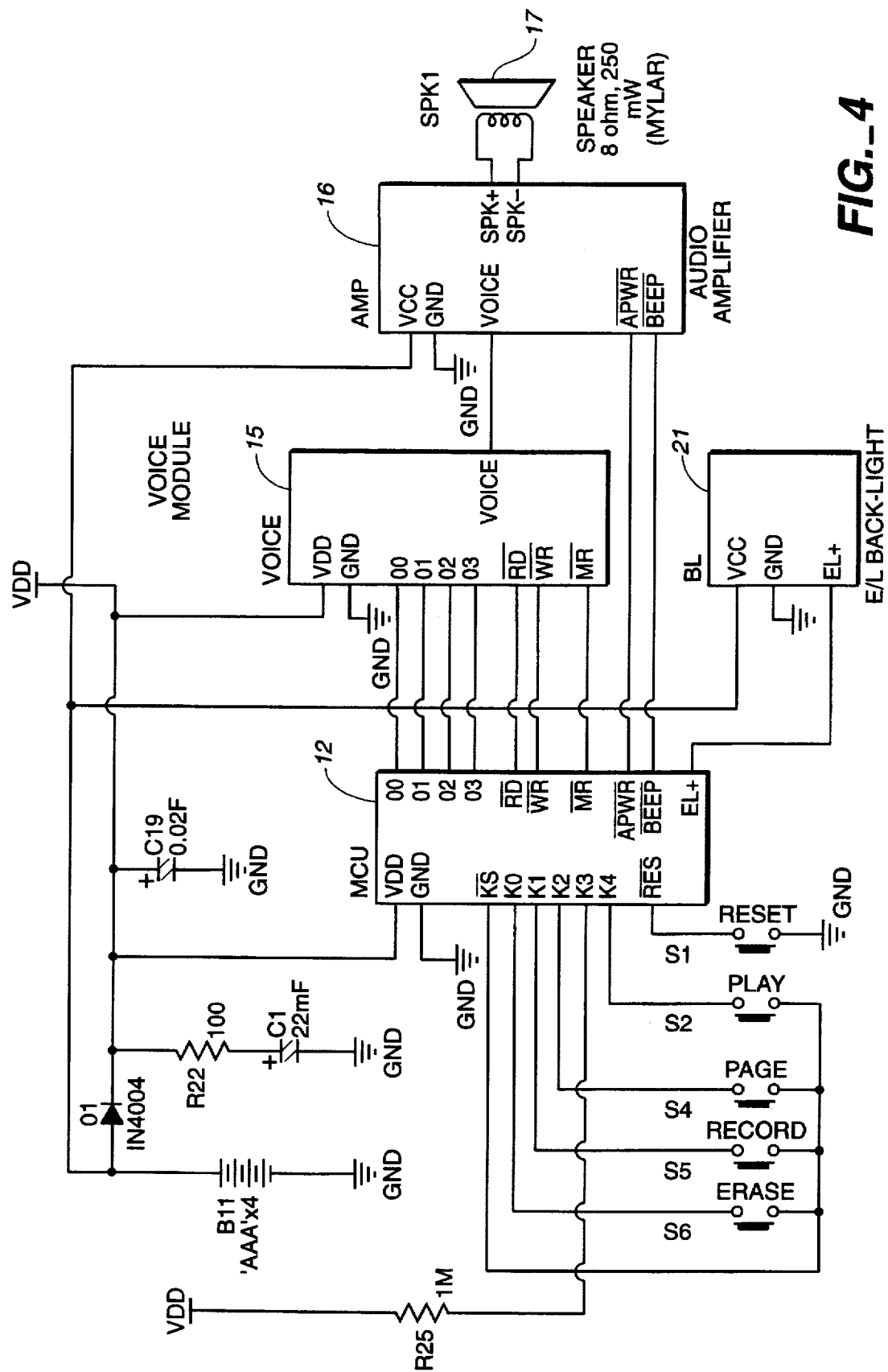
FIG._4

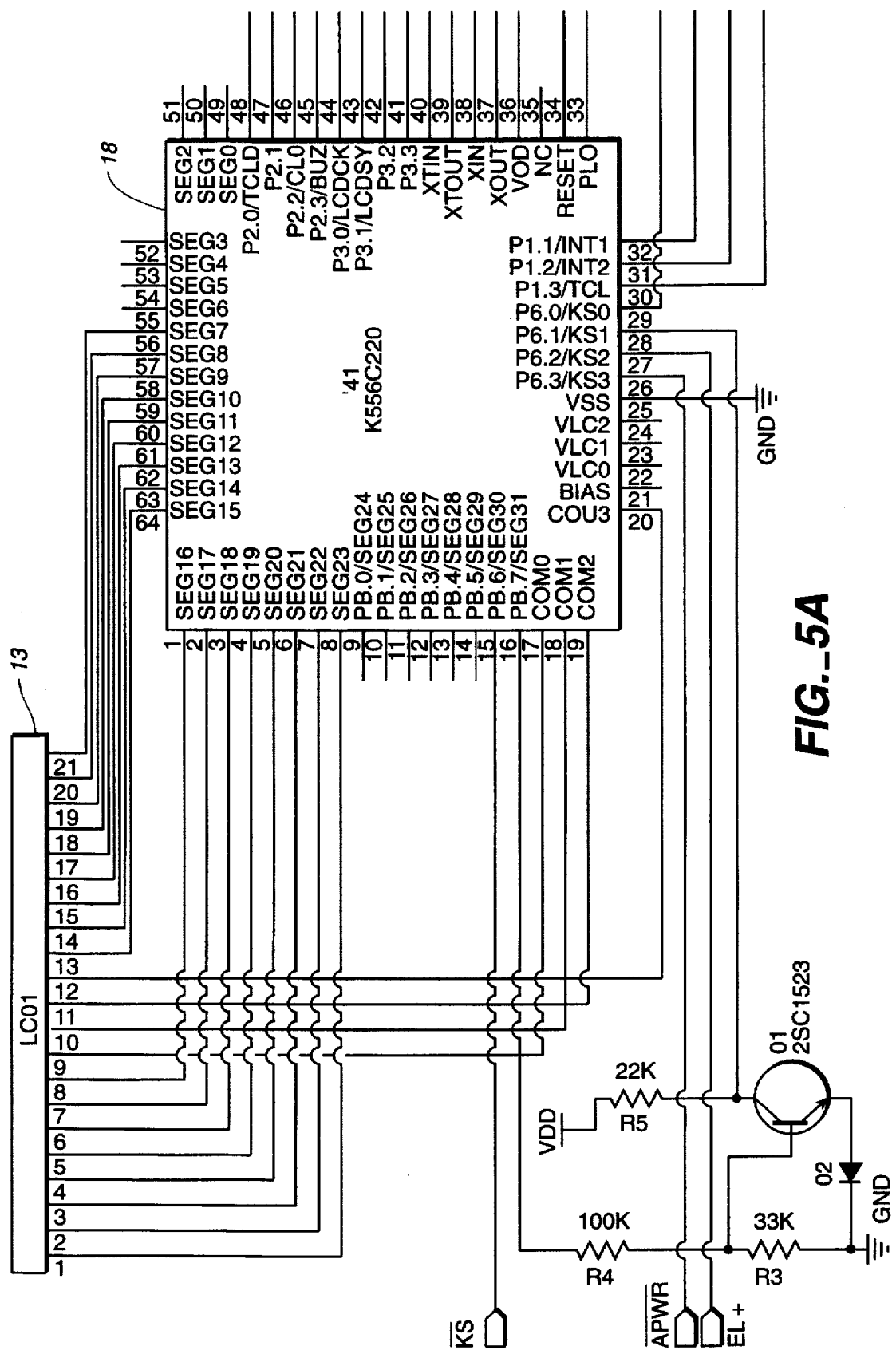
FIG._5A

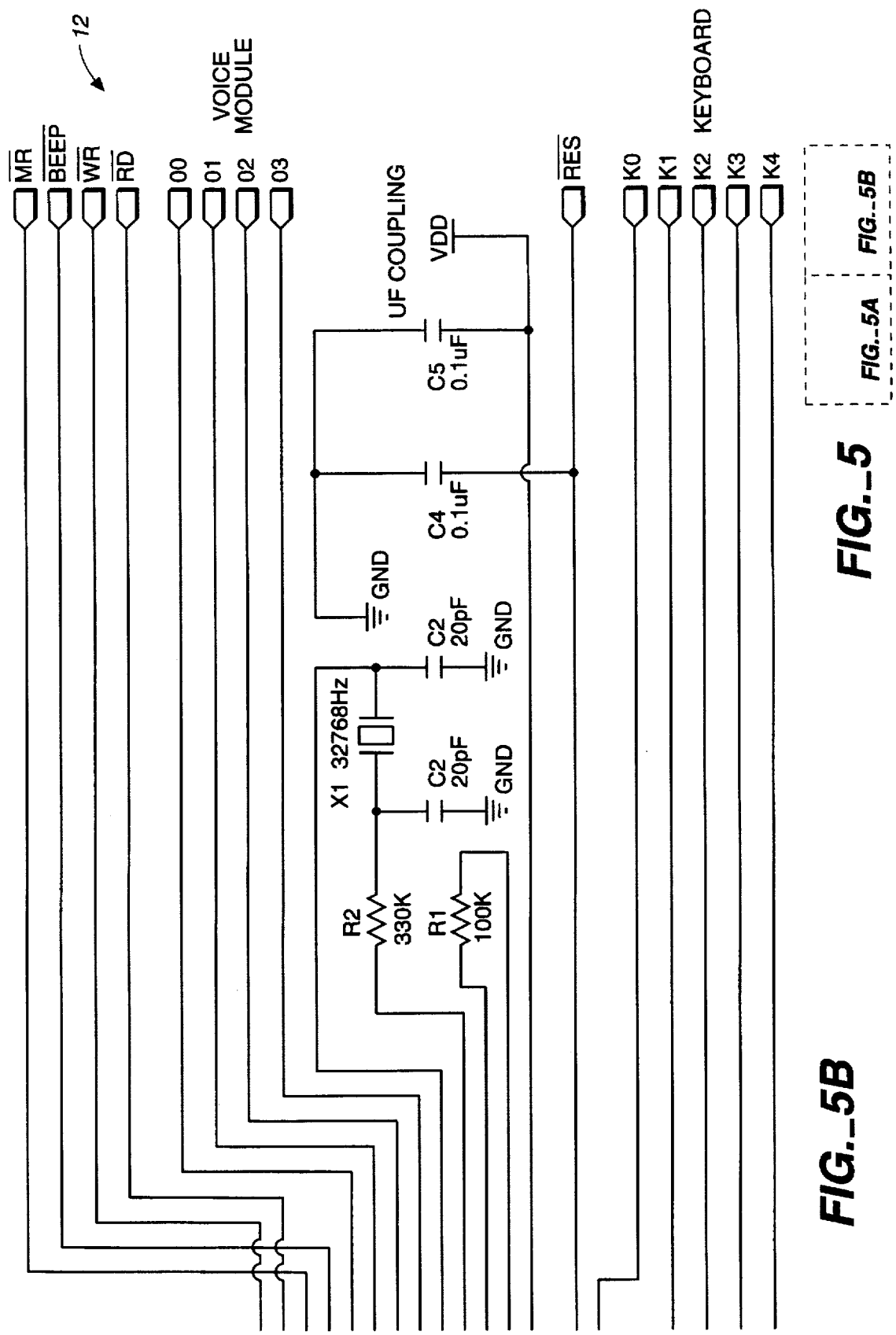
FIG._5B
FIG._5

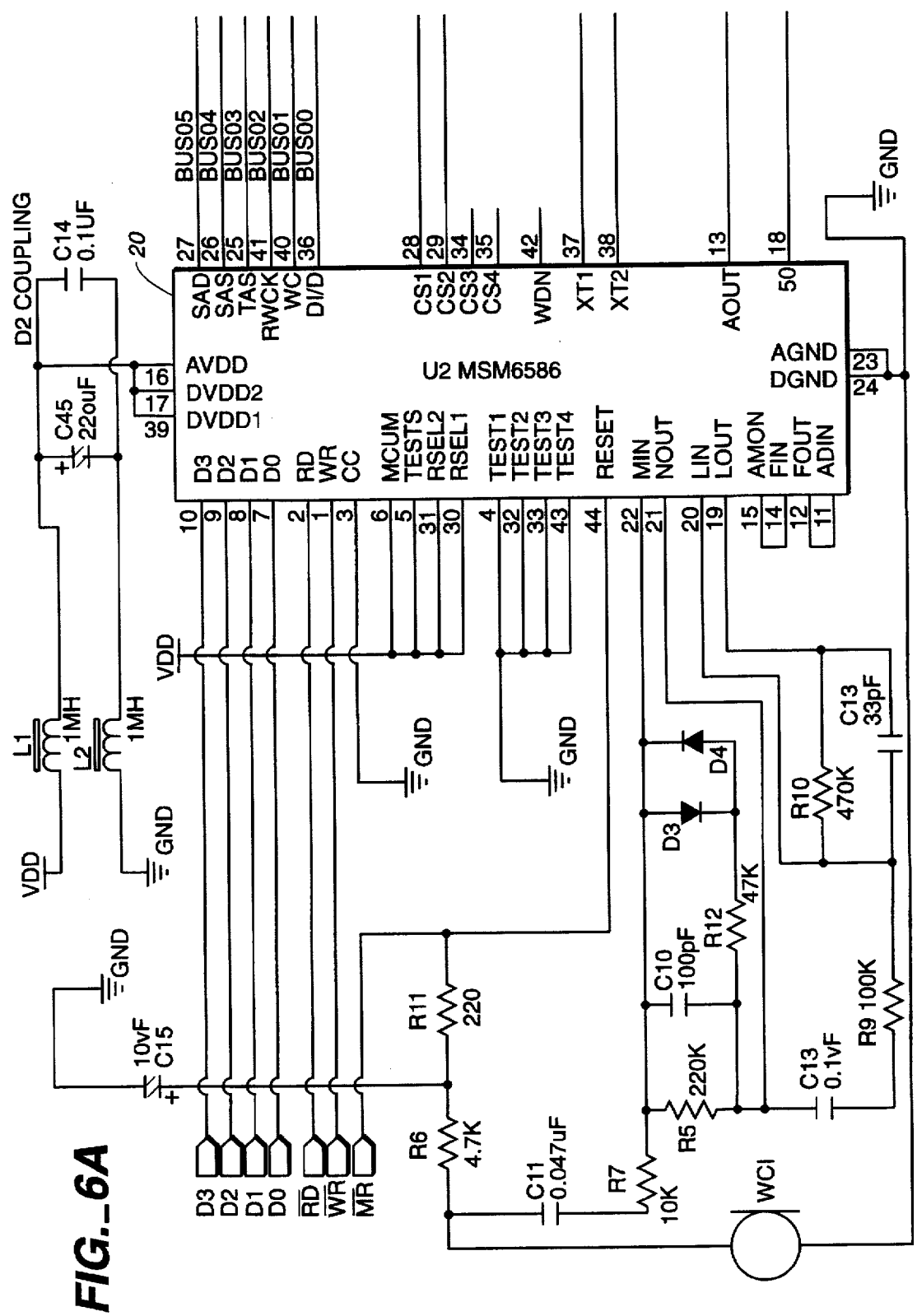
FIG._6A

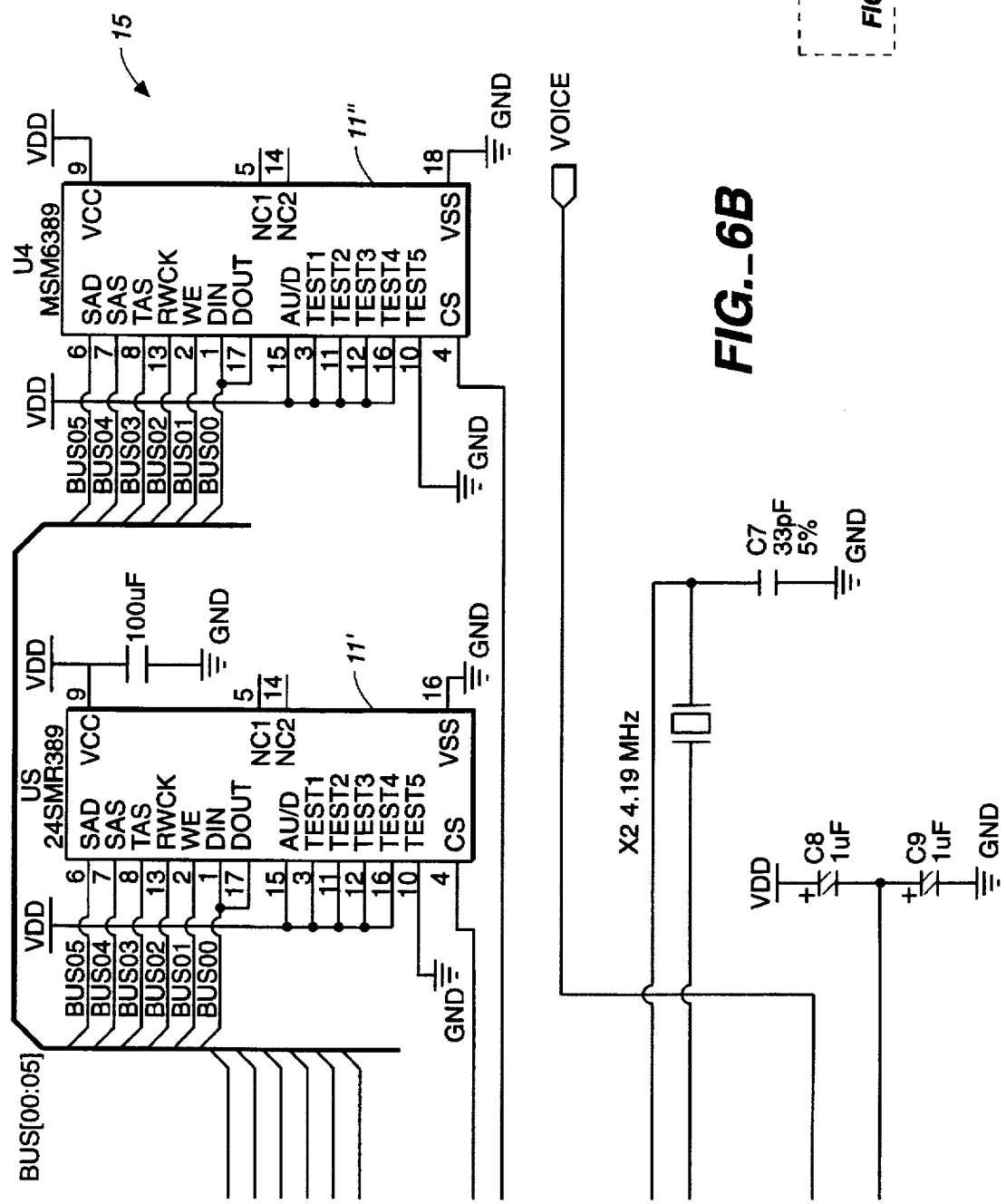

DIGITAL RECORDER APPARATUS WITH GRAPHICAL DISPLAY REPRESENTATION AND METHOD

TECHNICAL FIELD

The present invention relates, generally, to storage and retrieval systems, and, more particularly, relates to hand-held digital recorders.

BACKGROUND ART

Digital electronic technology is quickly supplanting analog electronic technology in many commercial and industrial applications. Not only is digital technology often more accurate and precise, in many instances, technological improvements and advances have been developed which otherwise might not have been possible.

For example, hand-held digital recorders offer greater recording and playback control than conventional analog recording devices. Individual recordings can be played, erased and stored, independent of one another; a feature which analog tape recorders are not capable of providing. Hence, in addition to improved audio clarity, digital recording devices enable substantial operator convenience improvements.

The digital recorder operating system typically stores each individual data recording at discrete locations on a digital memory device for near instantaneous access and selective removal. As the data recordings accumulate in the memory device, each recording may be sequentially assigned an identification number or the like which corresponds to that particular recording. Upon one or more data recordings being selectively deleted, the remaining recordings thereafter may be renumbered in the chronological order recorded.

One problem associated with these hand-held digital recorders is that the identification numbers are generally only singly displayed on a display screen in the order chronological received. Recalling one particular data recording, without the operator having previously memorized the exact location or position thereof relative the remaining recording, is difficult and time consuming. Typically, the operator must page through and sample each recording sequentially before retrieving the desired recording. Moreover, erasing one or more messages may cause the sequence to be renumbered adding to retrieval problems.

DISCLOSURE OF INVENTION

Accordingly, it is an object of the present invention to provide a recorder apparatus which digitally operable.

Another object of the present invention is to provide a hand-held digital recorder apparatus and method which graphically and visually facilitates retrieval of the data recordings.

Still another object of the present invention is to provide a hand-held digital recorder apparatus and method which graphically illustrates the length and location of the data recordings relative the remaining data recordings.

It is a further object of the present invention to provide a hand-held digital recorder apparatus and method which is durable, compact, easy to maintain, has a minimum number of components, and is easy to use by unskilled personnel.

In accordance with the foregoing objects, the present invention provides a digital recorder apparatus including a digital memory unit formed to store independent data records, and retrieve selected ones of the data records. An electronic unit, coupled to the digital memory unit, is included which determines the storage location and data length of a respective data record in the digital memory. A graphical display device, coupled to the electronic unit, graphically represents the length and location of the data records in the digital memory unit by corresponding record icons to visually facilitate retrieval of the selected ones of the data records.

The graphical display device preferably includes index icons each of which corresponds to one of a plurality of storage blocks, each of which stores a portion of the independent data records therein. Selection or activation of a particular index icon enables access to those independent data records assigned to the storage block.

Each record icon may include an indicia icon, identifying the corresponding data record relative the other data records during user selection of one of the record icons, and a length icon corresponding to the length of the independent data record relative the storage block.

The present invention further includes a method for accessing stored independent data records from a digital memory unit of a hand-held digital recorder apparatus which includes the steps of: determining the location and length of each data record relative one another in the digital memory unit, and graphically representing on a display device the length and location of the data records, relative one another, by corresponding record icons. These icons, accordingly, visually facilitate retrieval of the data records. Finally, retrieving the selected data record from the memory unit by selecting the corresponding record icon.

BRIEF DESCRIPTION OF THE DRAWING

The assembly of the present invention has other objects and features of advantage which will be more readily apparent from the following description of the best mode of carrying out the invention and the appended claims, when taken in conjunction with the accompanying drawing, in which:

FIG. 1 is a top perspective view of a hand-held digital recorder apparatus with graphical display representation constructed in accordance with the present invention.

FIG. 2 is a top plan view of the hand-held digital recorder apparatus of FIG. 1.

FIG. 3 is an enlarged, fragmentary top plan view of the graphical display representation of the hand-held digital recorder apparatus of FIG. 2.

FIG. 4 is a schematic of a preferred embodiment of the digital recorder apparatus according to the present invention.

FIG. 5 is a detailed schematic of the microcomputer electronic unit from the schematic of FIG. 4.

FIG. 6 is a detailed schematic of the voice module unit from the schematic of FIG. 4.

BEST MODE OF CARRYING OUT THE INVENTION

While the present invention will be described with reference to a specific embodiment, the description is illustrative of the invention and is not to be construed as limiting the invention. Various modifications to the present invention can be made to the preferred embodiments by those skilled in the art without departing from the true spirit and scope of the invention as defined by the appended claims. It will be noted here that for a better understanding, like components are designated by like reference numerals throughout the various figures.

Attention is now directed to FIGS. 1 and 2, and the schematic diagrams of FIGS. 4–6, where a digital recorder apparatus, generally designated 10, is illustrated including a digital memory unit 11 formed to store data records, and retrieve selected ones of the data records. An electronic unit, generally designated 12, is coupled to digital memory unit 11 which determines the storage location and data length of each respective data record relative one another in digital memory unit 11. A graphical display, generally designated 13, is also coupled to electronic unit 12 that graphically represents the data length and location of the data records, stored in digital memory unit 11, with corresponding record icons 14 to visually facilitate retrieval of the selected ones of the data records.

Accordingly, the present invention provides a digital recorder which graphically represents each data record on a graphical display, simultaneously, through record icons. Each record icon illustrates the location and length of the corresponding data record, relative to the remaining data records, to simplify organization, retrieval and enable visual categorization thereof. Further, while the present invention is described primarily in connection with hand-held digital recorders, it will be appreciated that the concept of the present invention may be incorporated into most digital recorders, such as desk-top versions.

Turning now to FIG. 4, the basic schematic of the digital recorder apparatus of the present invention is set forth. The basic components include the microcomputer electronic unit 12, a voice module 15 and an audio amplifier 16 coupled to a speaker 17. The schematic of FIG. 5 illustrates in more detail electronic unit 12 including microchip 18 and a conventional Liquid Crystal Display (LCD) 13, while FIG. 6 illustrates the voice module 15 in detail. It will be understood that the recording device itself used in combination with the present invention may be provided by most conventional digital recorders. Briefly, the digital recorder voice chip 20 of voice module 15 (FIG. 6) is preferably provided by an OKI Semiconductor MSM6588 ADPCM Solid-State Recorder coupled to two memory units 11' and 11". Further, LCD display 13 is preferably illuminated by a backlighting unit 21 (FIG. 4). It will be appreciated, however, that a variety of display screens could be employed with the present invention.

The present invention preferably includes four index icons $22_A$, $22_B$, $22_C$ and $22_D$ (FIG. 3), each of which enables access to a set of corresponding record icons $14_A$, $14_B$, $14_C$ and $14_D$ for storing and retrieving the corresponding independent data record sets. Digital memory units 11', 11" are preferably divided into corresponding independent storage blocks (i.e., four storage blocks) for recording the respective data record sets therein. Hence, the electronic unit will assign each data record of a set to a particular storage block, depending upon which index icon is currently activated at the time of the recording. In turn, electronic unit 12 will graphically represent on graphical display 13 each data record, of a particular set, as a record icon 14 of the corresponding set of record icons.

Preferably, index icons $22_{A-D}$ graphically represent turned-up page corners, as shown in FIG. 3, positioned at the lower right corners of corresponding page outlines $23_A$, $23_B$, $23_C$ and $23_D$. The page figurines, thus, represent sheets of writing. Once an index icon is selected and activated, to access the corresponding storage block, it may be highlighted for identification. This highlighting feature also identifies which set of record icons may be currently accessed.

Highlighting may be provided in the form of darkening the turned-up corner and/or by flashing or blinking at a preferred frequency of about 1 Hz rate duty cycle. In the preferred form, flashing of a darkened index icon (e.g., index icon 22c in FIG. 3) will indicate that the corresponding page is active so that any one of the record icons from that active set may be selected to access the corresponding data record. A non-flashing darkened index icon, on the other hand, indicates that although the corresponding set of record icons may be selected, the recording apparatus is currently in the "stand-by" mode, which recording apparatus 10 will automatically enter after non-operation of about 60 seconds. Incidently, operation of any button will turn-on the recorder apparatus.

To select a set of record icons $14_{A-D}$ corresponding to one of the index icons $22_{A-D}$, a paging button 25 is provided enabling the user to "page" through or hop from index icon-to-index icon. The paging order through the index icons $22_{A-D}$, is preferably A-B-C-D-A. Further, the paging button 25 is situated at a top portion of the recording apparatus housing 26 for easy operation of button 25.

In accordance with the present invention, each record icon 14 includes an indicia icon 27 which represents and corresponds to an individual data record. The indicia icons are preferably represented by a shaded dot or bullet. Upon recording a new data record or message, an indicia icon 27 will visually appear to graphically indicate or mark the location and beginning of the record icon 14 which corresponds to the new data record. Therefore, as shown in FIG. 3, five indicia icons 27 on index page $23_A$, indicates a record icon set $14_A$ of five individual messages; while two indicia icons 27 on index page $23_C$ indicates a record icon set $14_C$ of two individual messages; and only one message each on index pages $23_B$ and $22_D$.

Further, each record icon 14 includes a length icon 28 for graphically illustrating the relative length of the corresponding data record. In the preferred form, each length icon 28 is provided by an extendable timeline 30 which proportionately increases in length relative the increase in length of the corresponding data record during recording. FIG. 3 illustrates that each timeline 30 may be divided into a plurality of vertically spaced lines sequentially aligned in rows. During recording, as the corresponding data records increase in length, an additional line 30 is sequentially added (preferably below the previous line).

Each line therefore represents a predetermined period of recording time. In the preferred embodiment, each line represents approximately three (3) seconds of recording time. A three-line timeline 30, such as in the first record icon $14_C$ of index icon $22_C$, graphically indicates about nine (9) seconds of recorded data.

During recording, the individual lines of extendable timeline 30 are preferably visually illuminated in total, rather than progressively increasing in length (in real time), at the beginning of each predetermined period of recording time. For example, in the three-line timeline 30 of first record icon $14_C$ of index icon $22_C$, the first timeline $30_{C1}$ is illuminated in total during the data recording at the beginning of the first predetermined time period from a 0–3 seconds; while the second timeline $30_{C2}$ is illuminated in total at the beginning of the second predetermined time period from 3–6 seconds. Finally, the third timeline $30_{C3}$ is illuminated at the beginning of the third time period from 6–9 seconds.

Each set of record icons $14_{A-D}$, corresponding to each page $23_{A-D}$, is capable of holding about ten lines of recorded data, or about 30 seconds per page. This is clearly illustrated in FIG. 3 for record icon sets $14_A$ and $14_D$ of index icons $22_A$ and $22_D$). Accordingly, each page is capable of holding one—30 second message, two—15 second messages, etc., up to five—6 second messages. The total recording capacity for the four individual pages $23_{A-D}$, therefore, would equate to about one-hundred twenty seconds of recording time.

It will be appreciated, however, that the recording and playback length of each line may vary depending upon the total recording capacity of the digital recorder. For instance, a 6 second recording time per line would provide about two-hundred forty seconds of total recording at 60 seconds per page.

To record a data record, a blank recording slot must be selected or created (i.e., by deleting an existing data record) in one of the storage blocks corresponding to index icons $22_{A-D}$ (e.g., portions of pages $23_B$, and $23_C$ in FIG. 3). Upon selection of the appropriate blank recording slot, the paging button 25 must first be operated to activate index icon $22_C$, for example, to access the corresponding storage block.

A record button 31, preferably positioned on the left side of housing 26, is provided and formed to be continuously depressed for the duration of the recording, while release of record button 31 stops the recording. The microcomputer electronic unit will default the recording to the first available recording space. For example, the electronic unit will default the recording to the vacant storage space 32 represented above record icon $14_{C1}$ when index icon $22_C$ is activated. However, since the first recording space 32 is limited by record icon $14_{C1}$ and its corresponding data record, only two lines of recording, or 6 seconds, would be permitted. The recording time, therefore, will be limited to the remaining space before an existing recording (record icon $14_{C1}$ in this example).

Incidentally, to record a data record in the second space 33 of page $23_C$, either the microcomputer electronic unit will default the recording to this space after recording data in the first space 32, or the user will have to index the curser to record icon $14_{C1}$ before activating the record button 31.

Upon recording, a corresponding indicia icon 27 visually appears at the left side of the activated page, and remains highlighted (preferably flashing at a 1 Hz rate duty cycle), as well as the first timeline $30_{C1}$). Upon surpassing the first prerecorded time period, corresponding to 0–3 seconds of recording time, the second timeline $30_{C2}$ is activated and highlighted by flashing, while the first timeline remains illuminated without flashing. After the operator releases the record button, the whole record icon flashes to indicate the current active curser position.

To retrieve a data recording, similar to the record mode, the proper page (i.e. index icons $22_{A-D}$) must be selected for access the corresponding set of record icons $14_{A-D}$ and data records of the storage block assigned to that page. After the proper page is activated, an indexing button 35 must be operated to move the curser (represented by the highlighted or flashing record icon) to identify which record icon 14 on that selected page is to be activated for retrieval. Upon selection of the desired record icon, a playback or retrieval button may be operated for playback of the desired data recording. In the preferred embodiment, the indexing button and the playback button are preferably co-operated by the same button 35, which is positioned on the left side of housing 26.

When the recorder apparatus 10 is in the "stand-by"mode, operation of any button will activate the recorder apparatus and begin flashing the record icon last activated. By depressing the playback button the first time, the corresponding data recording will be retrieved. Indexing through the plurality of record icons 14 is accomplished by depressing the index/playback button 35 twice which automatically activates the next record icon in sequence which is then highlighted while being retrieved. Similarly, depressing the index/playback button three consecutive times moves the curser to the third record icon which is highlighted, and begins retrieval of the corresponding data record. Incidently, paging through the individual pages $23_{A-D}$, using the paging button 2B, defaults the playback of the data record to the first record icon at the top of the activated page.

In accordance with the present invention, during playback of a multiple line recording, such as record icon $14_{C1}$, only the indicia icon 27 and the first timeline $30_{C1}$ will be flashing during the first period the retrieval from a 0–3 seconds. Subsequently, the second timeline $30_{C2}$ will begin flashing during the second period of the playback from 3–6 seconds, while the first timeline $30_{C1}$ and the third timeline $30_{C3}$ remain illuminated but non-flashing. This feature enables the user to graphically visualize the relative position of the playback relative the full recording.

To delete a desired data recording, the corresponding record icon must be activated (via, paging and indexing). An erase button 36 is provided on the topside of housing 26 which may be depressed for a predetermined continuous period of time before deletion is permitted to occur. Subsequently, the corresponding record icon is removed from the storage block and page. Further, a whole page or all the data recordings may be deleted simultaneously through a reset button (not shown).

It will be appreciated that other means of paging around and accessing data may be employed besides push buttons such as through touch-screen technology or the like without departing from the true spirit and nature of the present invention.

From the description of the present apparatus, it will be understood that a method for accessing stored independent data records from a digital memory unit of a hand-held digital recorder apparatus 10 comprises the steps of: (A) determining the location and length of each data record relative one another in the digital memory unit 11; and (B) graphically representing on display 13 the length and location of the data records by corresponding record icons 14 to visually facilitate retrieval of selected ones of the data records. The present method further includes the step of (C) retrieving the selected one of the data records from memory unit 11 by selecting the corresponding record icon 14.

The method of the present invention may further include the step of: indexing through indicia icons 27 of the record icons 14 to enable selection of one of the record icons 14 for retrieval of the corresponding data record. This step may include sequentially highlighting, such as by flashing, the indicia icon to be retrieved.

Further, step (C) may include the step of displaying the length and duration of the data records through a length icon 28 which increases in length as a function of the length of the corresponding data record.

The method may further include the step of paging through index icons 22, each corresponding to one of the storage blocks and each enabling access thereto, upon activation of the index icon, for retrieval of selected ones of the data records from the portion.

What is claimed is:

1. A digital recorder apparatus comprising:
  a digital memory unit formed to store independent data records, and retrieve selected ones of said data records;
  an electronic unit, coupled to said digital memory unit, that determines storage location and data length of each respective data record in said digital memory; and a graphical display, coupled to said electronic unit, that graphically represents length and location of said data records in said digital memory unit with corresponding record icons to visually facilitate retrieval of said selected ones of said data records.

2. The digital recorder apparatus as defined in claim 1 wherein,
each record icon further includes an indicia icon for indexing through the record icons during user selection of a selected one thereof.

3. The digital recorder apparatus as defined in claim 2 wherein,
each said indicia icon is highlighted during user selection of the corresponding record icon.

4. The digital recorder apparatus as defined in claim 2 wherein,
each record icon further includes a length icon representative of the length of the corresponding independent data record.

5. The digital recorder apparatus as defined in claim 4 wherein,
each length icon is provided by an extendable timeline representative of and responsive to the length and duration of the corresponding data record.

6. The digital recorder apparatus as defined in claim 5 wherein,
the extendable timeline is provided by a plurality of sequential lines each representing a predetermined period of time such that the sequential addition of the periods of time correspond to the total length and duration of the corresponding data record.

7. The digital recorder apparatus as defined in claim 6 wherein,
said predetermined period of time is about 3 seconds.

8. The digital recorder apparatus as defined in claim 6 wherein,
said plurality of sequent lines are aligned in rows.

9. The digital recorder apparatus as defined in claim 1 wherein, p1 each record icon further includes a length icon representative of the length of the corresponding independent data record.

10. The digital recorder apparatus as defined in claim 9 wherein,
each length icon is provided by an extendable timeline formed to increase in length as a function of the length of said data record.

11. The digital recorder apparatus as defined in claim 10 wherein,
the extendable timeline is provided by a plurality of sequential lines each representing a predetermined period of time such that the sequential addition of the periods of time correspond to the total length and duration of the corresponding data record.

12. The digital recorder apparatus as defined in claim 11 wherein,
said plurality of sequential lines are aligned in rows.

13. The digital recorder apparatus as defined in claim 9 wherein,
the length icon corresponding to a user selected data record is visually highlighted during one of the storage and the retrieval thereof.

14. The digital recorder apparatus as defined in claim 13 wherein,
the highlighted length icon is provided by flashing.

15. The digital recorder apparatus as defined in claim 1 wherein, said memory unit includes storage blocks each formed to store a portion of said independent data records therein, and said graphical display device includes index icons each corresponding to one of said storage blocks and each enabling access thereto, upon activation of said index icon, for retrieval of selected ones of said data records from said portion.

16. The digital recorder apparatus as defined in claim 15 wherein,
said index icons include page icons representing the corresponding storage block.

17. The digital recorder apparatus as defined in claim 16 wherein,
at least a portion of said index icons being visually highlighted during selective activation thereof.

18. The digital recorder apparatus as defined in claim 15 wherein,
each record icon further includes an indicia icon identifying the corresponding data record relative the other data records during user selection of one of the record icons.

19. The digital recorder apparatus as defined in claim 18 wherein,
each indicia icon being visually highlighted during user selection of the corresponding record icon.

20. The digital recorder apparatus as defined in claim 18 wherein,
each record icon further includes a length icon corresponding to the length of the independent data record relative the storage block.

21. The digital recorder apparatus as defined in claim 20 wherein,
each length icon is provided by an extendable timeline formed to increase in length as a function of the length of said data record.

22. The digital recorder apparatus as defined in claim 21 wherein,
the extendable timeline is provided by a plurality of sequential lines each representing a predetermined period of time such that the sequential addition of the periods of time correspond to the total length and duration of the corresponding data record.

23. A digital recorder apparatus as defined in claim 1 wherein,
said recorder apparatus is a hand-held digital recorder.

24. A hand-held digital recorder apparatus comprising:
a digital recording device having a memory formed for digitally storing a plurality of independent data record of information of known length at discrete addresses in said memory and formed for retrieval of selected ones of said plurality of independent data records; and a graphical display device coupled to said recording device, and formed to determine the location and length of said data record in said memory and responsive thereto to graphically represent an independent data record through a corresponding record icon, including a visual representation of the duration and location in said memory of said data record relative the other independent data records, to visually facilitate retrieval of said selected ones of said plurality of independent data record.

25. A method of accessing stored independent data records from a digital memory unit of a digital recorder apparatus comprising the steps of:

determining the location and length of each data record relative one another in said digital memory unit;

graphically representing on a display device the length and location of said data records by corresponding record icons to visually facilitate retrieval of selected ones of said data records; and retrieving said selected one of said data records from said memory unit by selecting the corresponding record icon.

26. The method according to claim 25 further including the step of:

indexing through indicia icons of said record icons to enable selection of one of the record icons for retrieval of the corresponding data record.

27. The method according to claim 26 wherein, said indexing step is accomplished by sequentially highlighting said indicia icon to be retrieved.

28. The method according to claim 25 wherein, said representing step includes the step of displaying the length and duration of the data records through a length icon increasing in length as a function of the length of the corresponding data record.

29. The method according to claim 28 further including the step of:

highlighting the corresponding length icon, during said retrieving step, of the selected one of said data records.

30. The method according to claim 29 wherein, said highlighting step is accomplished by flashing.

31. The method according to claim 25 wherein, said memory unit includes storage blocks each formed to store a portion of said independent data records therein, and further including the step of:

paging through index icons each corresponding to one of said storage blocks and each enabling access thereto, upon activation of said index icon, for retrieval of selected ones of said data records from said portion.

32. The method according to claim 31 further including the step of:

indexing through indicia icons of said record icons to enable selection of one of the record icons for retrieval of the corresponding data record.

33. The method according to claim 32 wherein, said indexing step is accomplished by sequentially highlighting said indicia icon to be retrieved.

34. The method according to claim 32 wherein, said record icon includes a length icon, and said representing step includes the step of displaying the length and duration of the data records through said length icon increasing in length as a function of the length of the corresponding data record.

35. The method according to claim 34 further including the step of:

highlighting the corresponding length icon, during said retrieving step, of the selected one of said data records.

36. The method according to claim 35 wherein, said highlighting step is accomplished by flashing.

* * * * *

UNITED STATES PATENT AND TRADEMARK OFFICE
CERTIFICATE OF CORRECTION

PATENT NO. : 5,684,506

DATED : November 4, 1997

INVENTOR(S) : TAYLOR et al.

It is certified that error appears in the above-identified patent and that said Letters Patent is hereby corrected as shown below:

Column 6, line 7, delete "2B" and insert therefor --25--.

Claim 8, column 7, line 37, delete "sequent" and insert therefor --sequential--.

Claim 9, column 7, line 39, immediately following "wherein," delete "p1".

Signed and Sealed this

Tenth Day of February, 1998

*Attest:*

BRUCE LEHMAN

*Attesting Officer*  *Commissioner of Patents and Trademarks*